United States Patent
Liu et al.

(10) Patent No.: US 11,336,182 B2
(45) Date of Patent: May 17, 2022

(54) DRIVING CIRCUIT WITH ENERGY RECYCLE CAPABILITY

(71) Applicant: xMEMS Labs, Inc., Santa Clara, CA (US)

(72) Inventors: Jing-Meng Liu, San Jose, CA (US); Jemm Yue Liang, Sunnyvale, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 17/352,346

(22) Filed: Jun. 20, 2021

(65) Prior Publication Data

US 2022/0021304 A1 Jan. 20, 2022

Related U.S. Application Data

(60) Provisional application No. 63/110,051, filed on Nov. 5, 2020, provisional application No. 63/053,662, filed on Jul. 19, 2020.

(51) Int. Cl.
*H02M 3/158* (2006.01)
*H02M 1/08* (2006.01)
(Continued)

(52) U.S. Cl.
CPC .......... *H02M 3/1582* (2013.01); *H02M 1/08* (2013.01); *H02M 3/155* (2013.01); *H04R 3/00* (2013.01); *H04R 17/00* (2013.01)

(58) Field of Classification Search
CPC ...... H02M 3/1582; H02M 1/08; H02M 3/155; H04R 3/00; H04R 17/00
See application file for complete search history.

(56) References Cited

U.S. PATENT DOCUMENTS 5,734,258 A * 3/1998 Esser ................. H02M 3/1582
 323/224
11,133,784 B2 * 9/2021 Liang .................... H03F 3/2178
(Continued)

FOREIGN PATENT DOCUMENTS

| CN | 103840663 A | 6/2014 |
| CN | 108569159 A | 9/2018 |

(Continued)

OTHER PUBLICATIONS

M. Hänsler et al., Design of a MEMS speaker driver, Elektrotechnik & Informationstechnik (2018), Jan. 23, 2018, pp. 10-17, 135/1, XP036438128, https://doi.org/10.1007/s00502-018-0593-8.

*Primary Examiner* — Kyle J Moody
(74) *Attorney, Agent, or Firm* — Winston Hsu

(57) ABSTRACT

A bidirectional charging and discharging circuit is coupled between a voltage source and a capacitive load and configured to drive the capacitive load. The bidirectional charging and discharging circuit includes a first switch, comprising a first terminal coupled to the voltage source; a second switch, comprising a first terminal coupled to a second terminal of the first switch, and a second terminal coupled to a ground; an inductor, comprising a first terminal coupled to the second terminal of the first switch and the first terminal of the second switch; a third switch, comprising a first terminal coupled to a second terminal of the inductor, and a second terminal coupled to a first terminal of the capacitive load; and a fourth switch, comprising a first terminal coupled to the second terminal of the inductor and the first terminal of the third switch, and a second terminal coupled to a ground.

26 Claims, 14 Drawing Sheets

(51) Int. Cl.
*H02M 3/155* (2006.01)
*H04R 3/00* (2006.01)
*H04R 17/00* (2006.01)

(56) References Cited

U.S. PATENT DOCUMENTS

| | | | |
|---|---|---|---|
| 2009/0039852 A1* | 2/2009 | Fishelov | H02M 3/157 323/283 |
| 2011/0235831 A1 | 9/2011 | Kaiho | |
| 2013/0015820 A1 | 1/2013 | Kim | |
| 2015/0367735 A1* | 12/2015 | Baker | H02M 3/1582 307/10.1 |
| 2016/0211750 A1 | 7/2016 | Coleman | |
| 2017/0207723 A1 | 7/2017 | Zhang | |
| 2017/0355364 A1 | 12/2017 | Wain | |
| 2018/0091056 A1 | 3/2018 | Reddiconto | |
| 2018/0257496 A1 | 9/2018 | Andoh | |
| 2019/0044488 A1 | 2/2019 | Travis | |
| 2019/0109530 A1* | 4/2019 | Perreault | H02M 3/1582 |
| 2019/0115830 A1 | 4/2019 | Giuliano | |
| 2020/0313567 A1 | 10/2020 | Porter, Jr. et al. | |
| 2020/0373841 A1* | 11/2020 | Xie | H02M 3/1582 |
| 2021/0044219 A1 | 2/2021 | Sato | |
| 2021/0194369 A1* | 6/2021 | Kim | H02M 3/1582 |

FOREIGN PATENT DOCUMENTS

| | | |
|---|---|---|
| CN | 108885677 A | 11/2018 |
| EP | 2 648 324 A2 | 10/2013 |
| EP | 2 648 324 A3 | 4/2018 |
| JP | 2000-333445 A | 11/2000 |
| JP | 2013-9176 A | 1/2013 |
| JP | 2013-9179 A | 1/2013 |
| JP | 2019-161689 A | 9/2019 |
| KR | 10-2014-0099207 A | 8/2014 |
| WO | 2014/110474 A1 | 7/2014 |
| WO | 2019/171701 A1 | 9/2019 |

* cited by examiner

DRIVING CIRCUIT WITH ENERGY RECYCLE CAPABILITY

CROSS REFERENCE TO RELATED APPLICATIONS

This application claims the benefits of U.S. provisional application No. 63/053,662, filed on Jul. 19, 2020 and U.S. Provisional Application No. 63/110,051, filed on Nov. 5, 2020, which are incorporated herein by reference.

BACKGROUND OF THE INVENTION

1. Field of the Invention

The present application relates to a driving circuit, and more particularly, to a driving circuit capable of energy recycling.

2. Description of the Prior Art

Recently, piezoelectric-actuated speakers (piezo-speakers) have emerged. Due to the capacitive nature of thin film piezoelectric actuators, these piezo-speakers present highly capacitive loads to the amplifiers. However, conventional driving circuits, such as class-AB, -D, —G, -H amplifiers, have all evolved assuming the loading (coils made of very fine wires) will be mostly resistive and slightly inductive; these amplifiers are inefficient when driving the highly capacitive loads such as piezo-speakers.

In addition, due to the capacitive nature of the load, the current and driving voltage would be about 90° out of phase. As a result, piezo-speakers do not actually consume much of the power during the charging operation (or cycle). Most of the energy drawn during the charging phase is stored inside the capacitance of the load. However, during the recycling/discharging operation (or cycle), when the voltage across the speaker terminals decreases, conventional class-AB, -D, -G or -H amplifiers will simply drain the energy from the capacitance of the load to the ground (or to the negative power supply), which is wasted.

Therefore, it is necessary to improve the prior art.

SUMMARY OF THE INVENTION

It is therefore a primary objective of the present application to provide a driving circuit capable of energy recycling, to improve over disadvantages of the prior art.

An embodiment of the present application discloses a driving circuit, wherein the bidirectional charging and discharging circuit is coupled between a voltage source and a capacitive load and configured to drive the capacitive load. The bidirectional charging and discharging circuit includes a first switch, comprising a first terminal coupled to the voltage source, and a second terminal; a second switch, comprising a first terminal coupled to the second terminal of the first switch, and a second terminal coupled to a ground; an inductor, comprising a first terminal coupled to the second terminal of the first switch and the first terminal of the second switch, and a second terminal; a third switch, comprising a first terminal coupled to the second terminal of the inductor, and a second terminal coupled to a first terminal of the capacitive load; and a fourth switch, comprising a first terminal coupled to the second terminal of the inductor and the first terminal of the third switch, and a second terminal coupled to a ground.

These and other objectives of the present invention will no doubt become obvious to those of ordinary skill in the art after reading the following detailed description of the preferred embodiment that is illustrated in the various figures and drawings.

DETAILED DESCRIPTION

In the present application, the term "coupled to" may refer to direct or indirect connection. "Component A being coupled to component B" may indicate that component A is directly connected to component B or component A is connected to component B via some component C.

To recycle the energy stored in the capacitive load, Applicant provides a driving circuit with energy recycle capability in U.S. application Ser. No. 17/022,060, so as to utilize a DC-DC converter circuit to function as charging circuit to charge up the capacitive load of a piezo speaker during the charging phase; and utilize another DC-DC converter circuit to function as discharging circuit to recycle the energy stored in the capacitive load of the piezo speaker back to a voltage source during the recycling/discharging phase. Thus, in the recycling/discharging phase, the capacitive load of the piezo speaker is treated as the source of energy and the normal voltage power source, which may be a Li-ion battery or the output capacitor of a DC-DC voltage power source, is treated as the destination of energy, and the energy is transferred (i.e. recycled) from the capacitive load of the piezo speaker back to the Li-ion battery or the output capacitor of the DC-DC voltage power source.

In U.S. application Ser. No. 17/022,060, some driving circuits are suitable for a power source with voltage higher than a load/output voltage, while other driving circuits are suitable for a power source with voltage lower than the load/output voltage. However, none of these circuits may produce a load/output voltage crossing the power source voltage.

Therefore, the present application provides a bidirectional circuit for a capacitive load of a piezo speaker, where the load/output voltage may swing above, below and across the voltage level of the power source.

In another aspect, just like a class-B amplifier, some BTL-like (BTL: bridge-tied-load) circuits in U.S. application Ser. No. 17/022,060 may be plagued by 0-crossing distortions. Therefore, the present application provides a bidirectional circuit with a mixed mode solution by applying single-end configuration for smaller signal swings while switching to BTL configuration for larger signal swings, to achieve both the lower-distortion of the single-end configuration and the doubling of output voltage range of BTL configuration.

Figure 7:
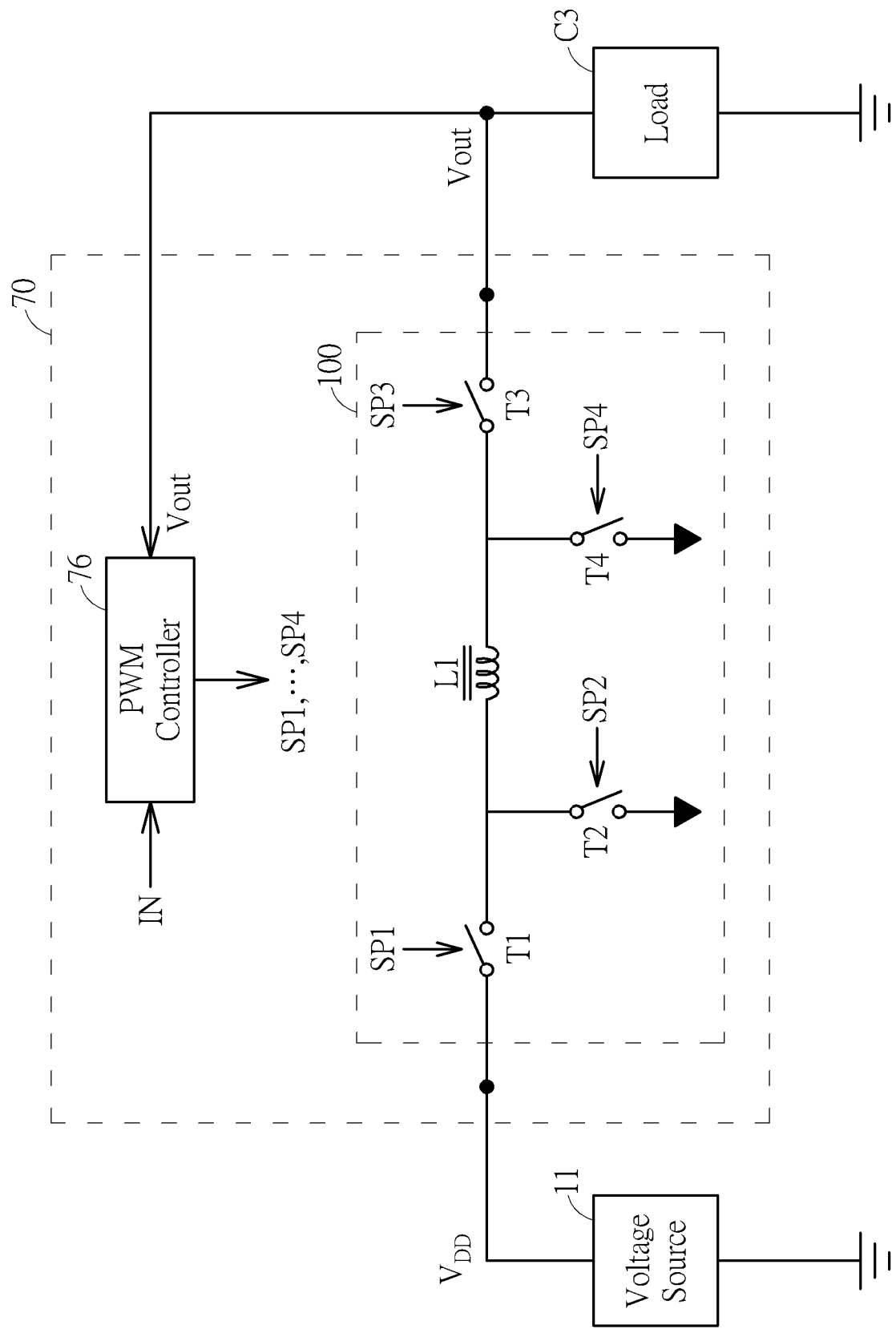
FIG. 7 is a schematic diagram of a driving circuit according to an embodiment of the present application.

FIG. 7 is a schematic diagram of a driving circuit 70 according to an embodiment of the present application. The driving circuit 70 comprises a pulse width modulation (PWM) controller 76 and a bidirectional circuit 100. The bidirectional circuit 100 is coupled between a voltage (power) source 11 and a capacitive load C3 (where the capacitive load C3 may comprise a piezo speaker), and configured to drive the capacitive load C3. Specifically, the bidirectional circuit 100 forms/drives a first current from the voltage source 11 to the capacitive load C3 when performing a charging operation, and forms/drains a second current from the capacitive load C3 to the voltage source 11 when performing a recycling operation.

The bidirectional circuit 100 includes switches T1-T4 and an inductor L1. The switch T1 includes a first terminal coupled to the voltage source 11. The switch T2 includes a first terminal coupled to the second terminal of the switch T1, and a second terminal coupled to a ground (in the embodiment shown in FIG. 7, but not limited thereto). The inductor L1 includes a first terminal coupled to the second terminal of the switch T1 and the first terminal of the switch T2. The switch T3 includes a first terminal coupled to the second terminal of the inductor L1, and a second terminal coupled to a first terminal of the capacitive load C3. The switch T4 includes a first terminal coupled to the second terminal of the inductor L1 and the first terminal of the switch T3, and a second terminal coupled to a ground (in the current embodiment shown in FIG. 7, but not limited thereto).

The PWM controller 76, receiving an input signal IN and coupled to the capacitive load C3, is configured to generate a plurality of PWM signals SP1-SP4, according to the input signal IN and an output signal Vout. The input signal IN may be an audio signal, which is time-varying. The PWM signals SP1-SP4 are configured to control the switches T1-T4, respectively, such that the bidirectional circuit 100 may perform the charging operation and perform the recycling operation. The bidirectional circuit 100 may perform the charging and recycling operations within different switching cycles. Via the charging and recycling operations (or by controlling the switches T1-T4 using the PWM signals SP1-SP4 the output signal Vout may be substantially proportional to the input signal IN, which means the output signal Vout is also time-varying.

In the present application, the output signal Vout being substantially proportional to the input signal IN implies that, $\|IN(t) - c \cdot Vout(t)\|^2 \le \varepsilon \cdot \|IN(t)\|^2$ is satisfied, where $\|s(t)\|^2$ may represents an energy of an arbitrary signal s(t), IN(t) and Vout(t) represent time-varying function of the input signal and the output signal, respectively, c represents a constant which can be either positive or negative, and $\varepsilon$ represent a small number which may be, e.g., $10^{-1}$, $10^{-2}$, $10^{-3}$ or less.

In the present application the terms "output voltage" and "output signal" sometimes are used interchangeably. Both "output voltage" and "output signal" are denoted as Vout. When the term "output voltage" is used, it focuses more on certain (voltage) value at the first terminal of the capacitive load C3 within a specific time interval, e.g., within a switching cycle. When the term "output signal" is used, it addresses more on Vout as/being a time varying function. In other words, "output voltage" represents an instantaneous value of "output signal".

Please refer to FIG. 1A, FIG. 1B, FIG. 2A and FIG. 2B, which are schematic diagrams of the bidirectional circuit 100 in states 110, 111, 120, 121, 210, 211, 220, 221 according to an embodiment of the present application.

Figure 1A:
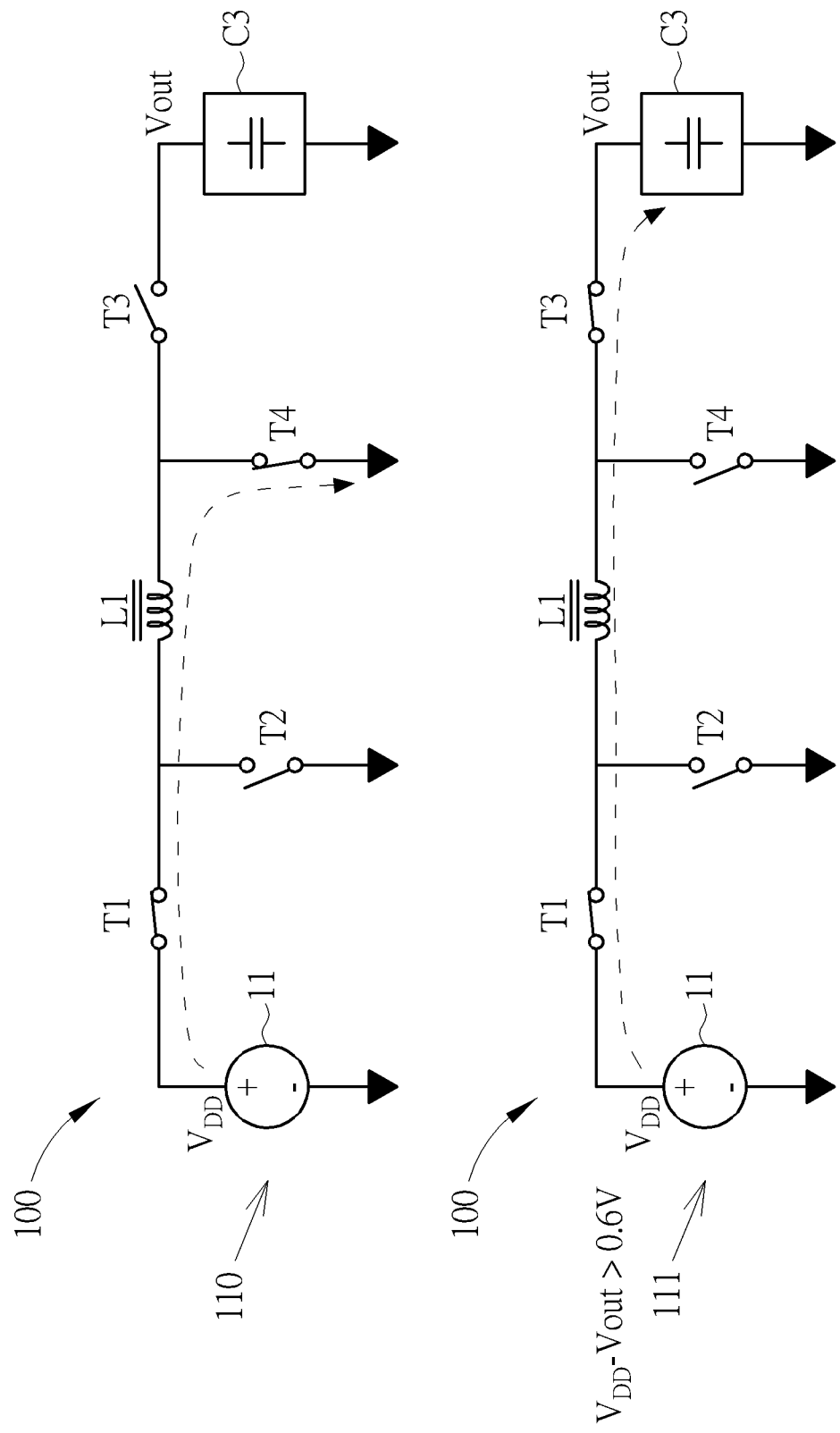
FIG. 1A, FIG. 1B, FIG. 2A and FIG. 2B are schematic diagrams of a bidirectional circuit in different states according to an embodiment of the present application.
Figure 1B:
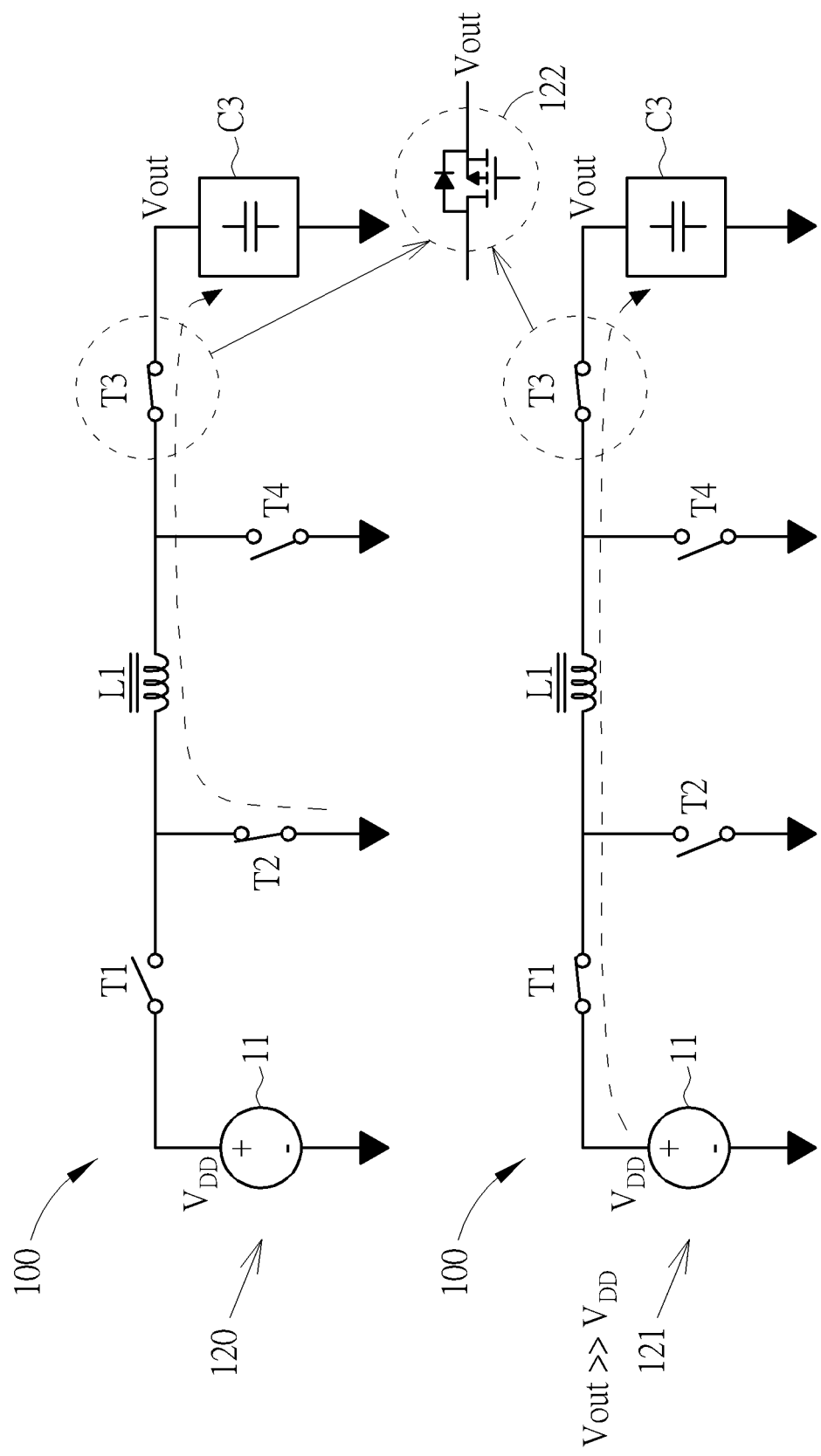
Figure 2A:
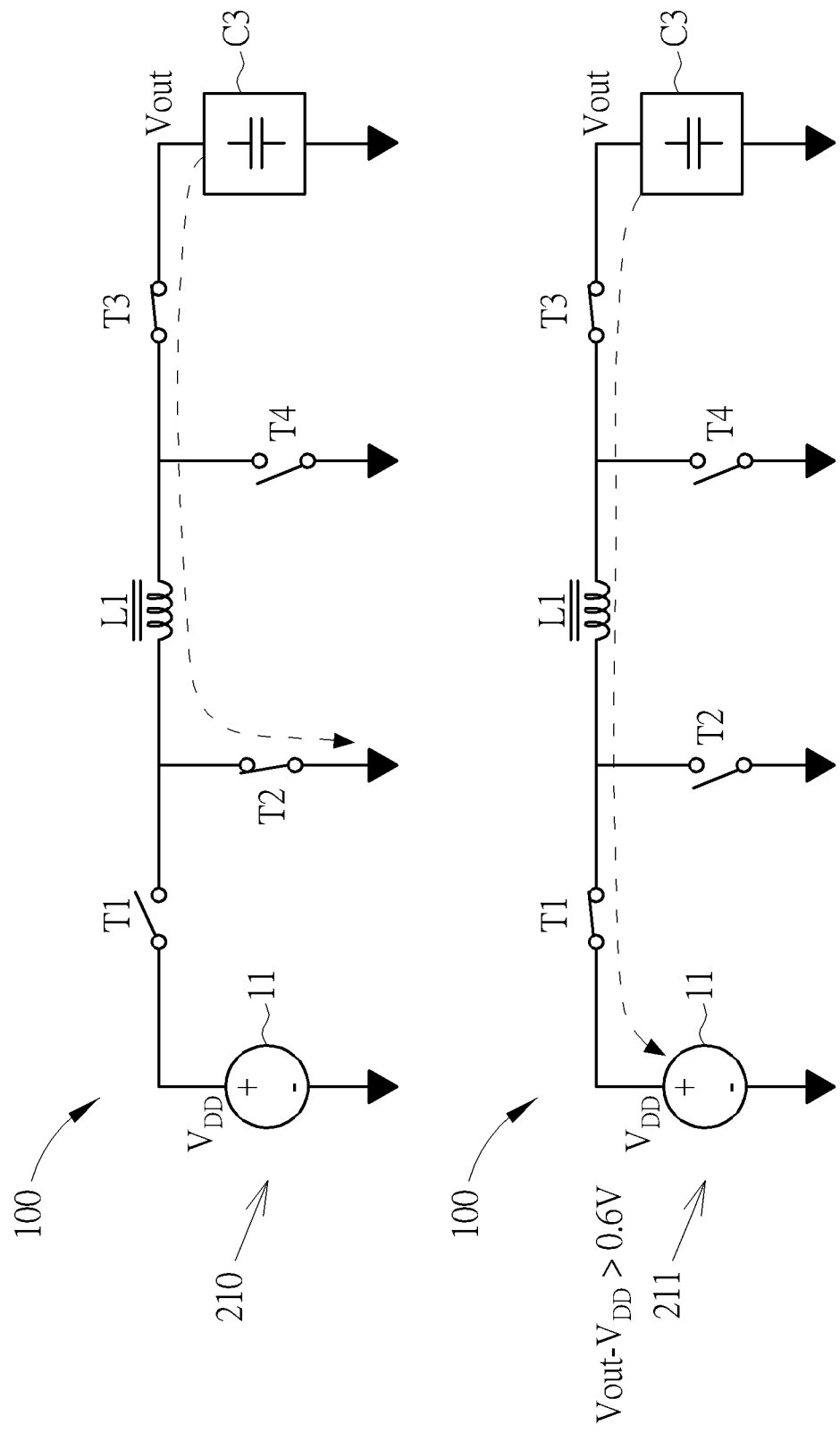
Figure 2B:
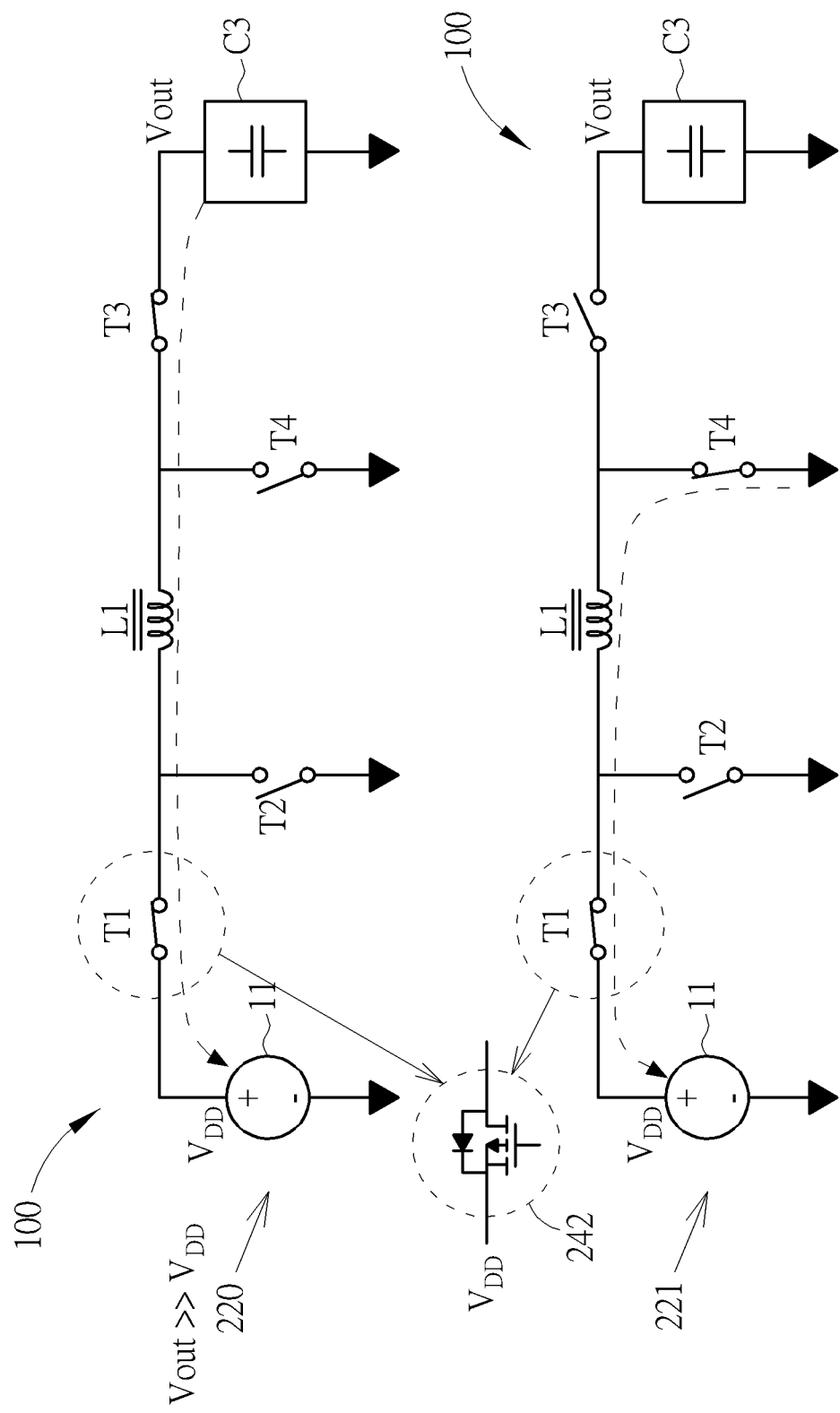

As shown in FIG. 1A, the states 110, 111 are two alternatives for transferring electrical energy from the voltage power source 11 with a source voltage $V_{DD}$ into the inductor L1, in the form of magnetic flux, during a 1st flux-increasing phase of the charging operation of the bidirectional circuit 100. As shown in FIG. 1B, the states 120, 121 are two alternatives for transferring magnetic flux energy from the inductor L1 to the capacitive load C3, in the form of charges, during a 2nd flux-decreasing phase of the charging operation of the bidirectional circuit 100. As shown in FIG. 2A, the states 210, 211 are two alternatives for transferring electrical energy from the capacitive load C3 of the piezo speaker into the magnetic flux energy of the inductor L1 during a 1st flux-increasing phase of the discharging (recycling) operation of the bidirectional circuit 100. As shown in FIG. 2B, the states 220, 221 are two alternatives for transferring magnetic flux energy from the inductor L1 back to electrical energy in the voltage power source 11 during a 2nd flux-decreasing phase of the discharging (recycling) operation of the bidirectional circuit 100.

In the present application, flux-increasing phase is also known as InFlux phase, and the terms of "flux-increasing phase" and "InFlux phase" may be used interchangeably. Similarly, flux-decreasing phase is also known as DeFlux phase, and the terms of "flux-decreasing phase" and "DeFlux phase" may be used interchangeably.

In detail, as shown in FIG. 1A, the states 110, 111 are two alternatives for performing the 1st flux-increasing phase of charging operation of the bidirectional circuit 100, wherein the switches T1, T4 are conducted in the state 110 and the switches T1, T3 are conducted in the state 111. During the 1st flux-increasing phase of charging operation, energy is stored into the inductor L1 in the form of magnetic flux and current flow. The amount of energy store in the inductor L1 at the end of this phase and its relationship to the voltage applied across the terminals of inductor L1 and the pulse width of the PWM control signal are described in Eq. 1 and Eq. 2 below.

The formula describing the energy stored in the inductor L1 is given below:

$$E = \tfrac{1}{2} L1 I_{L1}^2 \qquad \text{Eq. 1}$$

The energy transferred from a voltage $V_L$ to the inductor L1 can be calculated as:

$$E = \tfrac{1}{2} L1 \left( t_{PWM} \tfrac{V_L}{L1} \right)^2 = \tfrac{1}{2} \tfrac{(t_{PWM} V_L)^2}{L1} \qquad \text{Eq. 2}$$

where $t_{PWM}$ is the duration, the voltage $V_L$ is applied across the terminals of the inductor L1.

When the source voltage $V_{DD}$ is higher than a output voltage Vout at the first terminal of the capacitive load C3 by a sufficient/specific margin, e.g. $V_{DD} - \text{Vout} > V_M$, where $V_M$ represents a margin (in voltage) and may range from 1.2 V to 1.5V or be 1V, but not limited thereto, the state 111 of the bidirectional circuit 100 may be more efficient than the state 110 due to ability of the state 111 to lower the current flowing through the bidirectional circuit 100, which lowers the conduction loss due to the unavoidable resistances of the inductor L1 and the switches T1-T4. However, when the source voltage $V_{DD}$ is not higher than the output voltage Vout by the sufficient/specific margin, e.g. $V_{DD}$–Vout<$V_M$, the duration $t_{PWM}$ required to store a given amount of energy E into the inductor L1 in the state 111 may increase rapidly since the voltage $V_L$, as expressed in Eq. 2, is small ($V_L$=$V_{DD}$–Vout in the state 111), potentially causing the operation of the state 111 to fail.

Unlike the state 111, the bidirectional circuit 100 in the state 110 can handle all conditions of the output voltage Vout because, when in the 1st flux-increasing phase of charging operation in the state 110, the value of the voltage $V_L$ across the inductor L1 in Eq. 2 always equals the source voltage $V_{DD}$. Therefore, as can be derived from Eq. 2, the duration $t_{PWM}$ required to store a given among of energy E into the inductor L1 will be constant, independent of the value of the output voltage Vout. Therefore, the use of the state 111 is optional when the source voltage $V_{DD}$ is higher than the output voltage Vout by a sufficient margin, or $V_{DD}$–$V_M$>Vout, and higher efficiency is desirable, while the use of the state 110 is a must for the output voltage Vout>$V_{DD}$–$V_M$.

As shown in FIG. 1B, the states 120 and 121 are two alternative states for performing the 2nd flux-decreasing phase of charging operation of the bidirectional circuit 100, wherein the switches T2, T3 are conducted in the state 120 and the switches T1, T3 are conducted in the state 121. During the 2nd flux-decreasing phase of charging operation, the magnetic flux energy stored in the inductor L1 is transferred, via current flow, to the capacitive load C3 as electrical charge. During this phase, the switch T3, along with its body diode, allows the current to flow only from the inductor L1 toward the capacitive load C3, and is turned off (in "nonconducting" state) when the current of the inductor L1 diminishes to 0, following a style commonly referred to as synchronous mode switching in the field of DC-DC power conversion, by employing a zero-current-detection (ZCD) or zero-current-estimation (ZCE) circuit to generate the control signal of the switch T3.

Furthermore, the switches T1-T4 may implemented as MOSFET with embedded body-diodes. When the body diode of such MOSFET switch T3 is oriented from the inductor L1 toward the capacitive load C3, as indicated in a pop-out 122, then even if the switch T3 is not turned ON the function of directing the current to flow from the inductor L1 toward the capacitive load C3 (but not inversely), operations may still be performed correctly, albeit less efficiently (due to the high forward voltage drop over such body-diode). The existence of such body diode allows the width of the PWM control signal of the switch T3 to be narrower than would be required otherwise.

For most combinations of the source voltage $V_{DD}$ and the output voltage Vout, the 2nd flux-decreasing phase of the charging operation of the bidirectional circuit 100 may be performed under the state 120. However, when the output voltage Vout is higher than the source voltage $V_{DD}$ by a significant margin, e.g. Vout>$V_{DD}$+$V_M$, where $V_M$ may be 3V but not limited thereto, the state 121 of circuit 100 may be preferable to the state 120 due to its ability to avoid the PWM pulse width becoming too narrow when the level of Vout rises by changing the PWM pulse width of the 2nd flux-decreasing phase, as expressed by Eq. 2, from $$t_{PWM} = \frac{\sqrt{E \cdot L1}}{V_{OUT}} \text{ to } t_{PWM} = \frac{\sqrt{E \cdot L1}}{V_{OUT} - V_{DD}}.$$

Note that although connection configurations of the switches T1-T4 in the state 111 and the state 121 are the same, these two states however are actually meant for two completely different situations: the state 101 is for 1st flux-increasing phase (or InFlux phase) of charging operation when the source voltage $V_{DD}$ is higher than the output voltage/signal Vout by a sufficient/specific margin, e.g. $V_{DD}$>Vout+1V, while the state 121 is for 2nd flux-decreasing phase of charging operation when the output voltage Vout is higher than the source voltage $V_{DD}$ by a sufficient/specific margin, e.g. Vout>$V_{DD}$+3V. So, it will never occur where same connection scheme is employed both during the 1st flux-increasing phase and during the 2nd flux-decreasing phase of the charging operation of the bidirectional circuit 100.

Figure 3:
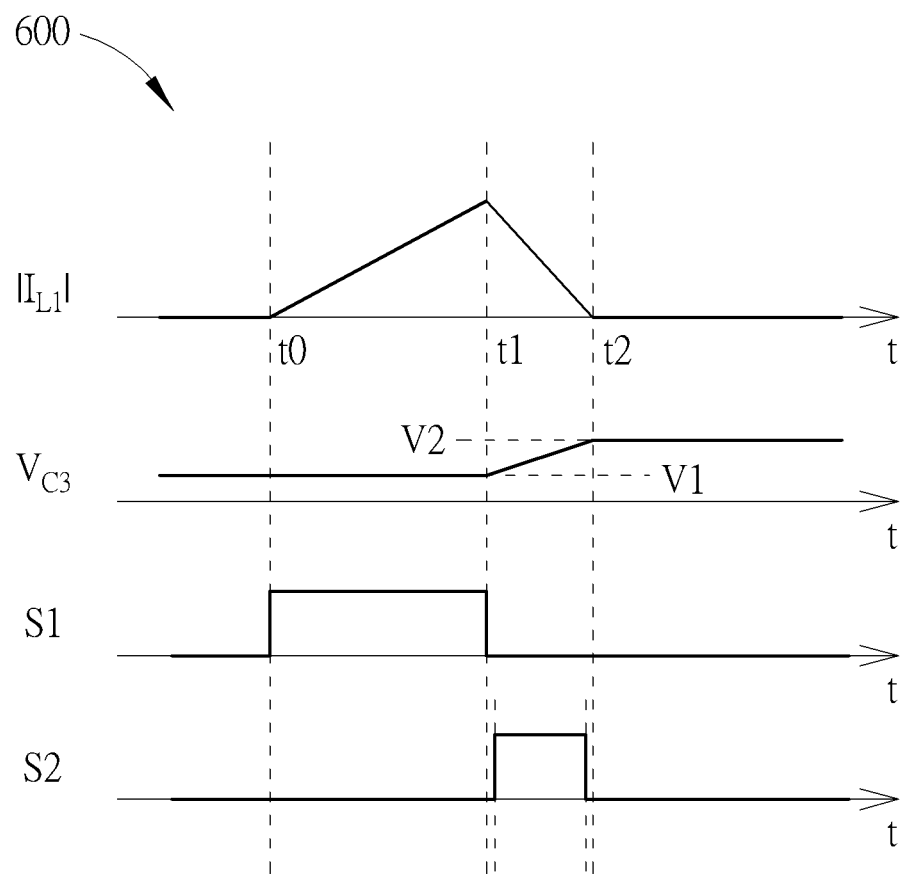
FIG. 3 is a schematic diagram of a charging operation of the bidirectional circuit according to an embodiment of the present application.

Please refer to FIG. 3, which is a control signal timing diagram of a charging or recycling/discharging operation of the bidirectional circuit 100 according to an embodiment of the present application, wherein a signal S1 is the control signal for switches (T1-T4) to be turned ON during the 1st flux-increasing phase and a signal S2 is the control signal for switches to be turned ON during the 2nd flux-decreasing phase. The signals S1 and S2 may schematically illustrate the PWM signals SP1-SP4 shown in FIG. 7.

For example, at t=t0, the 1st flux-increasing phase of the charging operation of the bidirectional circuit 100 starts by turning ON (put into "conducting" states) the switches T1 and T4 to activate the state 110 or by turning ON the switches T1 and T3 to activate the state 111. The magnitude of current |$I_{L1}$| in the inductor L1 will rise from 0 according to formula:

$$I_{L1} = \int_{t=t0}^{t} \frac{V_L}{L1} dt. \quad \text{(Eq. 3a)}$$

or when the voltage $V_L$ across the inductor L1 is constant:

$$I_{L1} = \frac{(t - t0)V_L}{L1}. \quad \text{(Eq. 3b)}$$

At t=t1, the charging operation of the bidirectional circuit 100 transitions into the 2nd flux-decreasing phase by turning OFF the switches T1 and T4 (or T1 and T3) and turning ON the switches T2 and T3 (or T1 and T3) to activate the state 120 (or the state 121) of the bidirectional circuit 100, directing the inductor current |$I_{L1}$| generated during the 1st flux-increasing phase toward capacitive load C3. The output voltage/signal Vout causes the inductor current |$I_{L1}$| to fall back to 0 during the 2nd flux-decreasing phase and the magnetic flux energy stored in the inductor L1 is transferred into electric charge Q stored capacitive load C3 of the piezo speaker, resulting in rise of the voltage $V_{C3}$ across the two terminals of the capacitive load C3, i.e. the voltage $V_{C3}$ rises from V1 to V2. Toward the end of the charging operation, a zero current detection circuit will turn OFF the switch T3 when the inductor current |$I_{L1}$| approaches 0.

It is conventional to insert a "dead time" between the ON period of the signal S1 and the ON period of the signal S2, as indicated by the small gap on the left side of the ON period of the signal S2. On the right side of the ON period of the signal S2 another small gap is shown before the current in the inductor L1 actually returns to 0. As discussed in a prior paragraph, during either of these two time gaps, by orienting body-diode of the switch T3 properly as illustrated in the pop-out 122, the current in the inductor L1 will flow correctly in both the states 120, 121.

Noticeably, recycling/discharging operations of the states 210, 211, 220, 221 in FIG. 2A and FIG. 2B may be derived by referring to charging operations of the states 110, 111, 120, 121 in FIG. 1A, FIG. 1B as operations in a reverse direction, and are not narrated herein for brevity.

The bidirectional circuit 100 works well for application where the output voltage/signal Vout needs not swing very close to 0V. However, when the output voltage/signal Vout falls below a threshold voltage, such as Vout<0.7V, the required ON period (i.e. the duration $t_{PWM}$) during the operations of both the state 120 and the state 210 will start to increase rapidly. Therefore, the bidirectional circuit 100 is best suited for situations where the output voltage Vout swings above 0V by a significant margin, but not suited for situations where the output voltage Vout needs to swing close to, or across, 0V.

Please refer to FIG. 4A, FIG. 4B, FIG. 5A and FIG. 5B, which are schematic diagrams of a bidirectional circuit 400 in states 410.S1, 410.S2, 415.S1, 415.S2, 420.S1, 420.S2, 425.S1, 425.S2 according to an embodiment of the present application. The bidirectional circuit 400 is similar to the bidirectional circuit 100, and elements with similar functions are denoted by the same symbols for simplicity. A main difference is that the bidirectional circuit 400 operates in a dual-mode, and includes a switch T5 and a load circuit C5 containing the capacitive load C3.

Figure 4A:
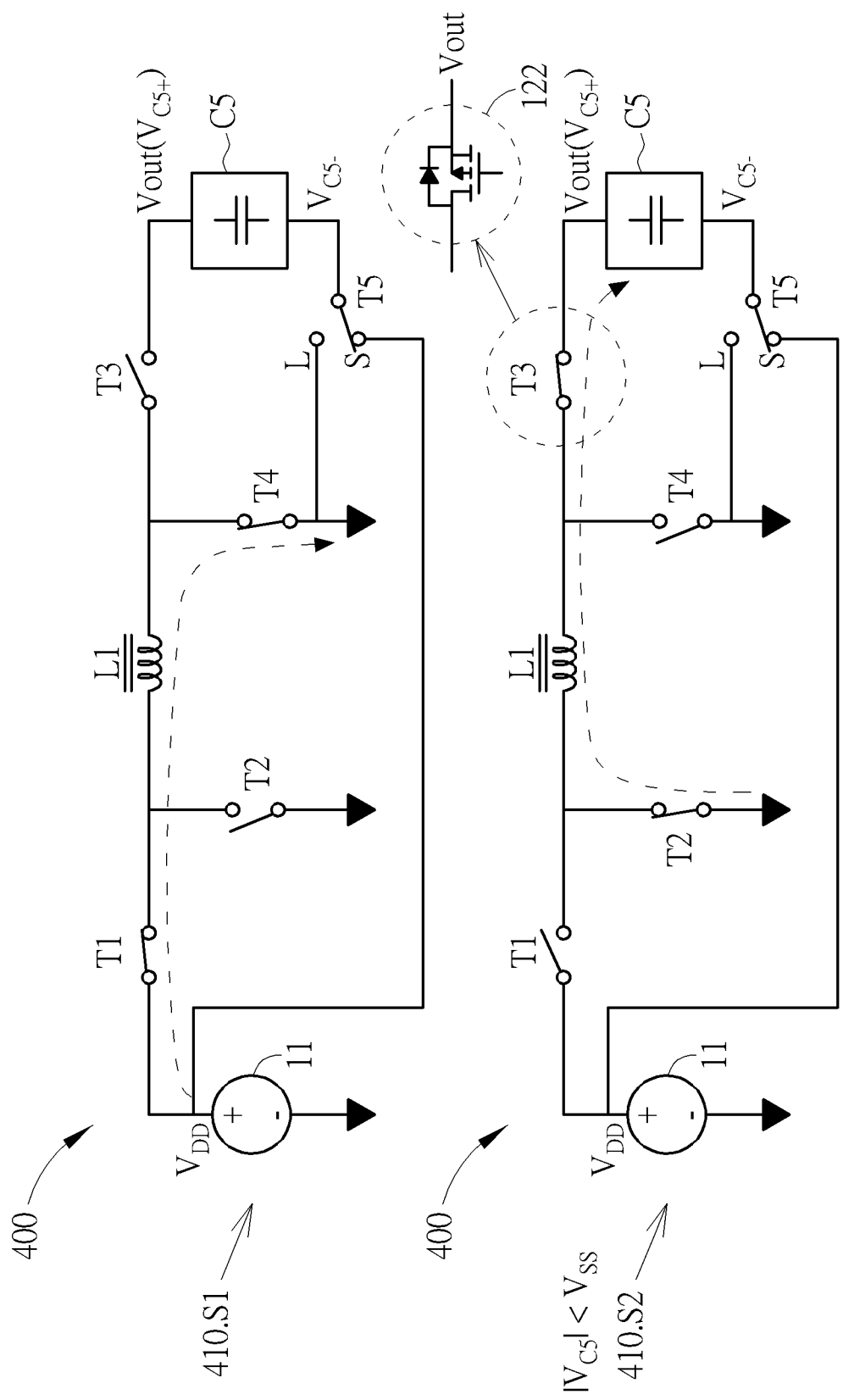
FIG. 4A, FIG. 4B, FIG. 5A and FIG. 5B are schematic diagrams of a bidirectional circuit in different states according to another embodiment of the present application.
Figure 4B:
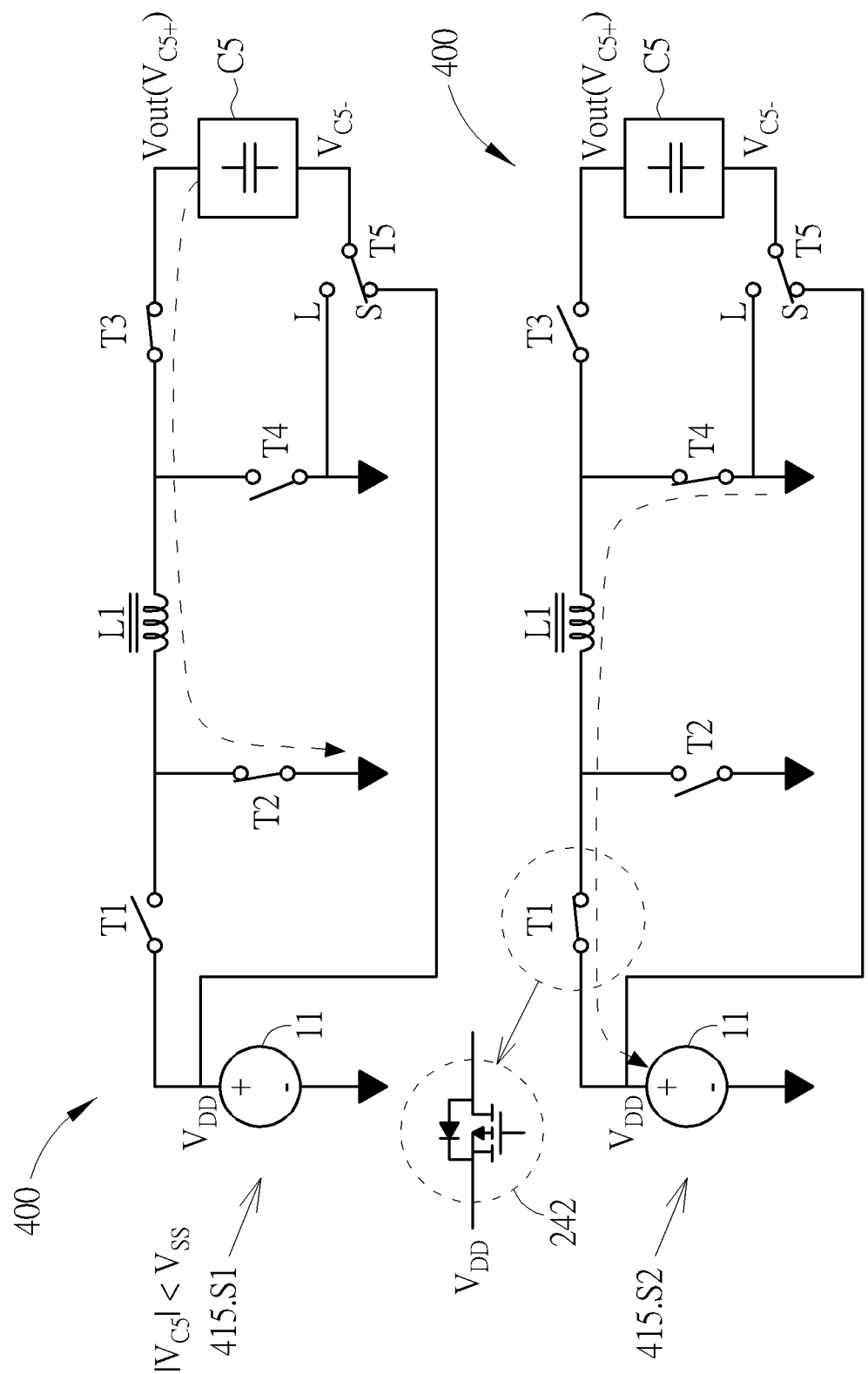
Figure 5A:
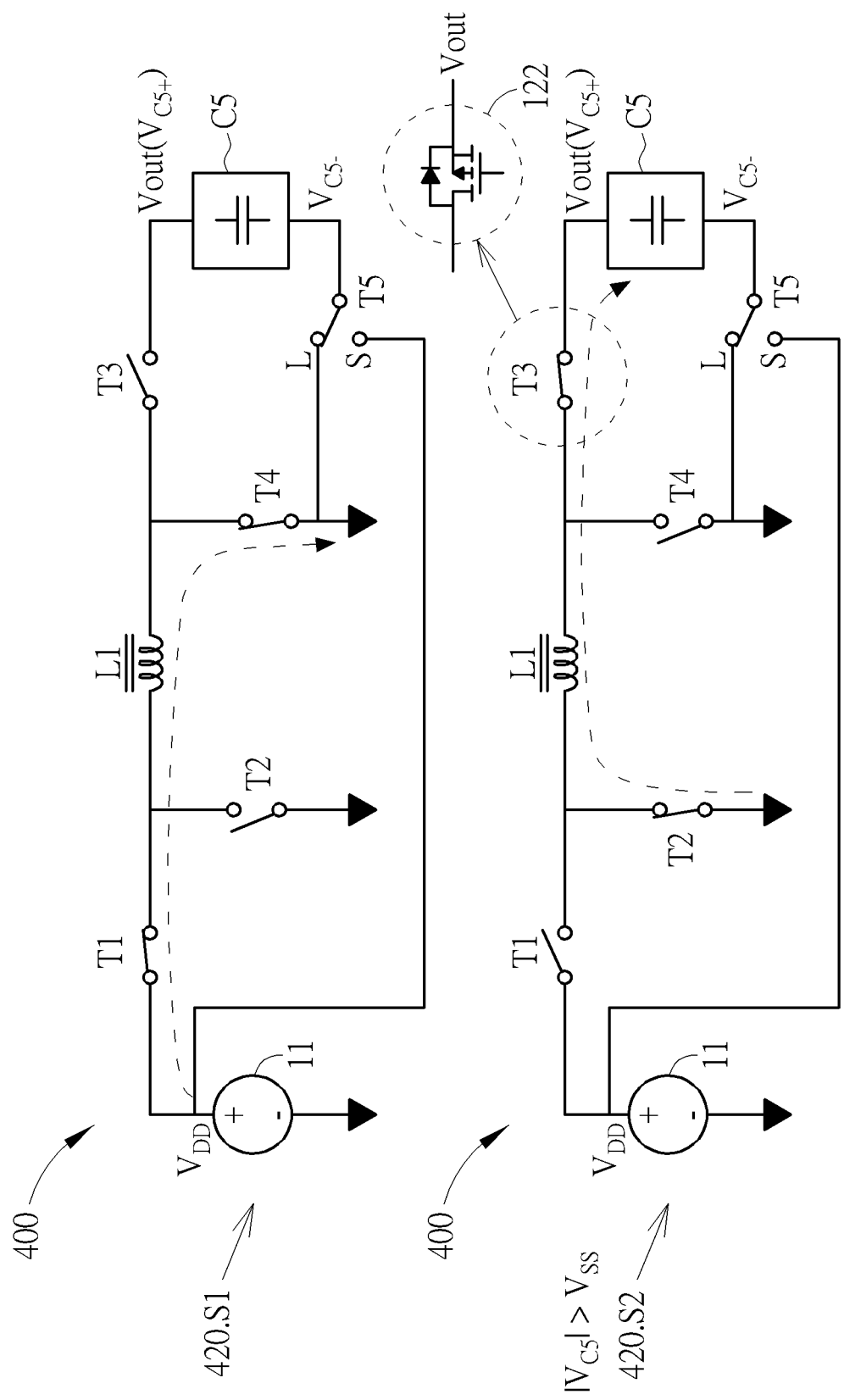
Figure 5B:
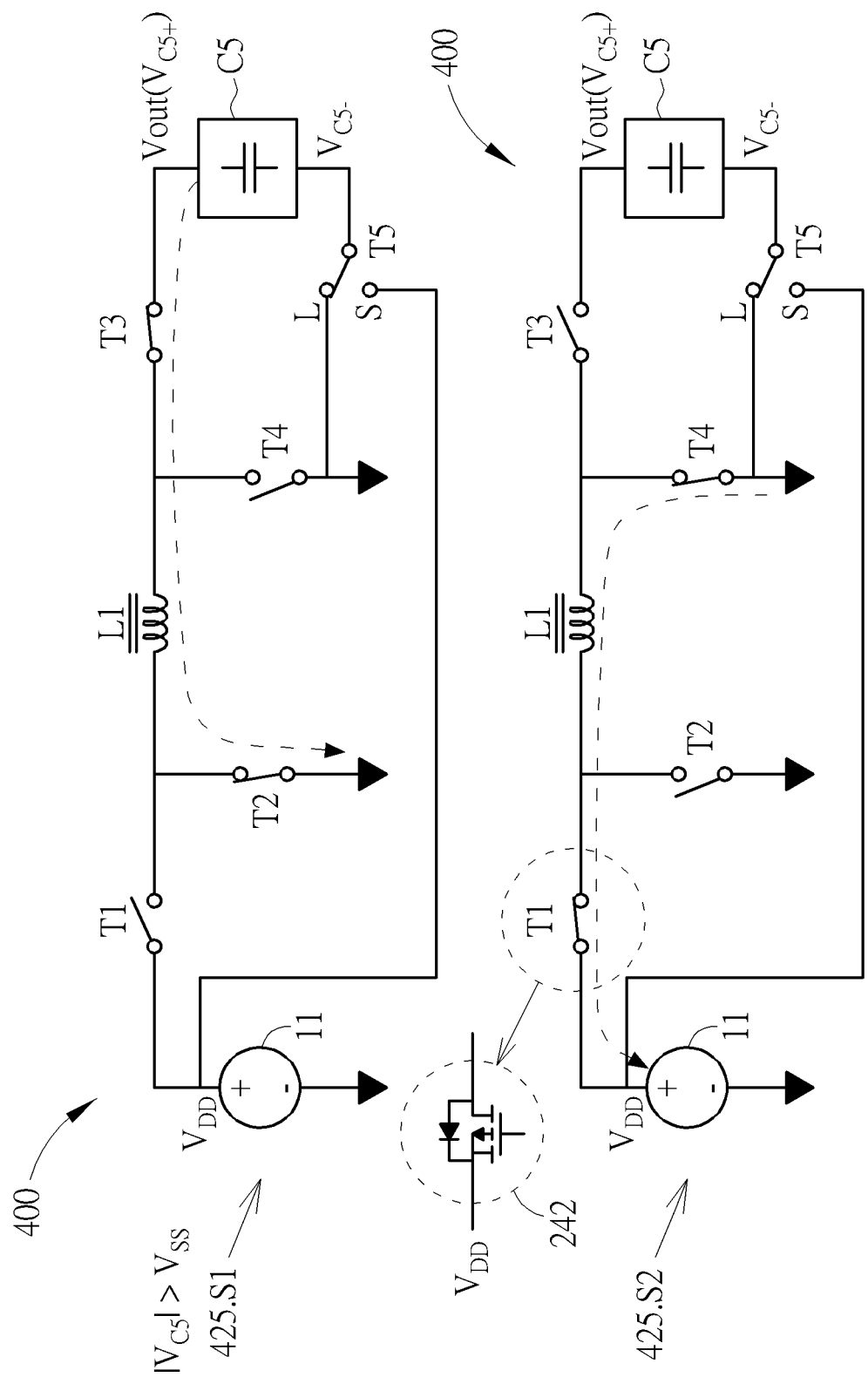

In detail, the four states 410.S1, 410.S2, 415.S1 and 415.S2 shown in FIG. 4A, FIG. 4B are for conditions where the magnitude of voltage $V_{C5}$ across a load circuit C5 is less than a threshold voltage $V_{SS}$, i.e. $|V_{C5}|<V_{SS}$, where the threshold voltage $V_{SS}$ may equal the source voltage $V_{DD}$ subtracting a modest margin, e.g. $V_{SS}=V_{DD}-V_M$ where $V_M$ may be 1.5V but not limited thereto, while the four states 420.S1, 420.S2, 425.S1 and 425.S2 in FIG. 5A and FIG. 5B are for conditions where the magnitude of voltage $V_{C5}$ across the load circuit C5 is greater than the threshold voltage $V_{SS}$, $|V_{C5}|>V_{SS}$, where the voltage $V_{C5}$ is the voltage across the load circuit C5, i.e. $V_{C5}=V_{C5+}-V_{C5-}$. For example, if $V_{DD}$=5V and $V_{SS}$=1.5V then $V_{SS}$=3.5V, the four states 410.S1, 410.S2, 415.S1 and 415.S2 shown in FIG. 4A, FIG. 4B are applicable for −3.5V<$V_{C5}$<3.5V while the four states 420.S1, 420.S2, 425.S1 and 425.S2 in FIG. 5A and FIG. 5B are applicable for either $V_{C5}$>3.5V or $V_{C5}$<−3.5V.

Figure 6:
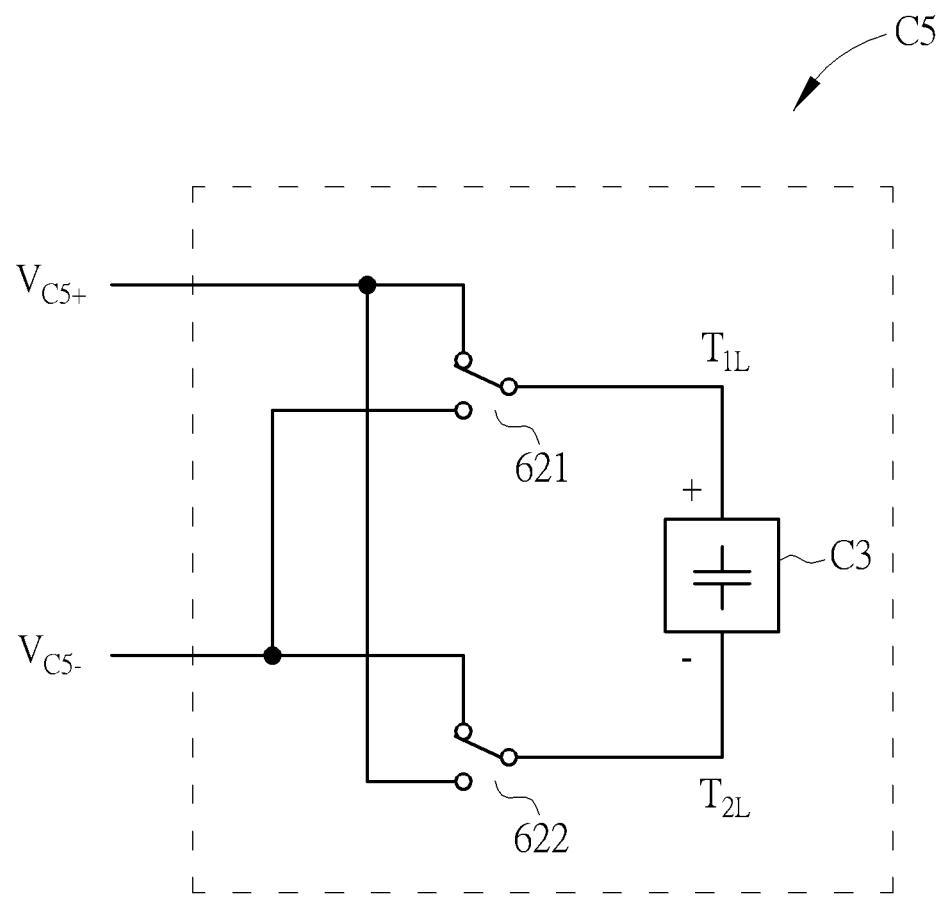
FIG. 6 is a schematic diagram of a load circuit according to an embodiment of the present application.

Please refer to FIG. 6, which is a schematic diagram of the load circuit C5 according to an embodiment of the present application. Operations of the load circuit C5 is similar to operations of the polarity toggle module 62 shown in FIG. 6 of U.S. application Ser. No. 17/022,060. When $|V_{C5}|\le V_{SS}$ or when $|V_{C5}|>V_{SS}$ and the input signal indicating $V_{C5}$ is to be positive, a first terminal of the capacitive load C3 (denoted as $T_{1L}$ in FIG. 6) is connected to a first node (i.e. a positive terminal of the load circuit C5 with $V_{C5+}$) by a toggle switch 621, and a second terminal of the capacitive load C3 (denoted as $T_{2L}$ in FIG. 6) is connected to a second node (i.e. a negative terminal of the load circuit C5 with $V_{C5-}$) by a toggle switch 622. When $|V_{C5}|>V_{SS}$ and the input signal indicating $V_{C3}$ is to be negative, the first terminal $T_{1L}$ is connected to the second node ($V_{C5-}$) by the toggle switch 621, and the second terminal $T_{2L}$ is connected to the first node ($V_{C5+}$) by the toggle switch 622.

Please refer back to FIG. 4A, FIG. 4B, when $|V_{C5}|<V_{SS}$, the second node (i.e. $V_{C5-}$) of the load circuit C5 is connected to the source voltage $V_{DD}$ by setting the single-pole-dual-throw (SPDT) switch T5 to an S position (stands for small voltage swing). During this mode, the bidirectional circuit 400 operates like a single ended amplifier with the $V_{C5-}$ terminal of the load circuit C5 fixed at the source voltage $V_{DD}$ while the voltage of the $V_{C5+}$ (Vout) terminal of the load circuit C5 may swing above, below and across the source voltage level of the terminal $V_{C5-}$ of C5, connected to $V_{DD}$.

During the 1st flux-increasing phase of the charging operation, the bidirectional circuit 400 will assume the state 410.S1 and, under the control of the signal S1, electrical energy from the source voltage $V_{DD}$ will be stored as magnetic flux energy in the inductor L1. During the 2nd flux-decreasing phase of the charging operation, the bidirectional circuit 400 will assume the state 410.S2 and, under the control of the signal S2, the magnetic flux energy stored in the inductor L1 will be transferred to the load circuit C5 as electrical energy. Note that, same as in the case of the state 120 or 121 and as illustrated in the pop out 122, the body diode of the switch T3 of FIG. 4A should be oriented such that the current may flow from the inductor L1 to the load circuit C5, but not inversely.

During the 1st flux-increasing phase of the discharging (recycling) operation, the bidirectional circuit 400 will assume the state 415.S1 and, under the control of signals for the switches T1-T4, electrical energy from the load circuit C5 will be stored as magnetic flux energy in the inductor L1. During the 2nd flux-decreasing phase of the discharging (recycling) operation, the bidirectional circuit 400 will assume the state 415.S2 and, under the control of signals for the switches T1-T4, the magnetic flux energy stored in the inductor L1 will be transferred back to the voltage power source $V_{DD}$ as electrical energy. Note that, same as in the case of the state 220 or 221 and as illustrated in the pop out 242, the body diode of the switch T1 of FIG. 4B should be oriented such that the current may flow from the inductor L1 to the voltage power source $V_{DD}$, but not inversely.

Note that, the previously discussed rapid rise of the required ON period (i.e. the duration $t_{PWM}$) in state 120 and state 210 of circuit 100 when the voltage across terminals of C3 (Vout) is at or near 0V, since such condition fulfills the $|V_{C5}|<V_{SS}$ criteria, is avoided in circuit 400 by the raising the output voltage Vout ($V_{C5+}$), together with $V_{C5-}$, to $V_{DD}$ where $$t_{PWM} = \frac{\sqrt{E \cdot L1}}{V_{OUT}}$$

will be well behaved. Such smoothness in 0V-crossing is a major advantage of circuit 400 over circuit 100.

When $|V_{C5}|>V_{SS}$, the second node (i.e. $V_{C5-}$) of the load circuit C5 is connected to the ground by the setting single-pole-dual-throw (SPDT) switch T5 to an L position (stands for large voltage swing). During this mode, the bidirectional circuit 400 will produce a driving waveform that is similar to a BTL amplifier where the "−" terminal $T_{2L}$ and the "+" terminal $T_{1L}$ of the capacitive load C3 will take turn to be connected, through the toggle switch 621 (or 622) to the output voltage Vout of the bidirectional circuit 400, producing the voltage $V_{C5}$, while the other terminal is connected, through the toggle switch 622 (or 621) to the ground.

During the 1st flux-increasing phase of the charging operation, the bidirectional circuit 400 will assume the state 420.S1 and, under the control of the signal S1, electrical energy from voltage source with the source voltage $V_{DD}$ will be stored as magnetic flux energy in the inductor L1. During the 2nd flux-decreasing phase of the charging operation, the bidirectional circuit 400 will assume the state 420.S2 and, under the control of the signal S2, the magnetic flux energy stored in the inductor L1 will be transferred to the load circuit C5 as electrical energy. Note that, as in the case of the state 120 or 121 and as illustrated in the pop out 122, the body diode of the switch T3 should be oriented such that the current may flow from the inductor L1 to the load circuit C5, but not inversely.

During the 1st flux-increasing phase of the discharging operation, the bidirectional circuit 400 will assume the state 425.S1 and, under the control of signals for the switches T1-T4, electrical energy from the load circuit C5 will be stored as magnetic flux energy in the inductor L1. During the 2nd flux-decreasing phase of the discharging operation, the bidirectional circuit 400 will assume the state 425. S2 and, under the control of signals for the switches T1-T4, the magnetic flux energy stored in the inductor L1 will be transferred back to the source voltage $V_{DD}$ as electrical energy. Note that, as in the case of the state 220 or 221 and as illustrated in the pop out 242, the body diode of the switch T1 should be oriented such that the current may flow from the inductor L1 to the source voltage $V_{DD}$, but not inversely.

Figure 8:
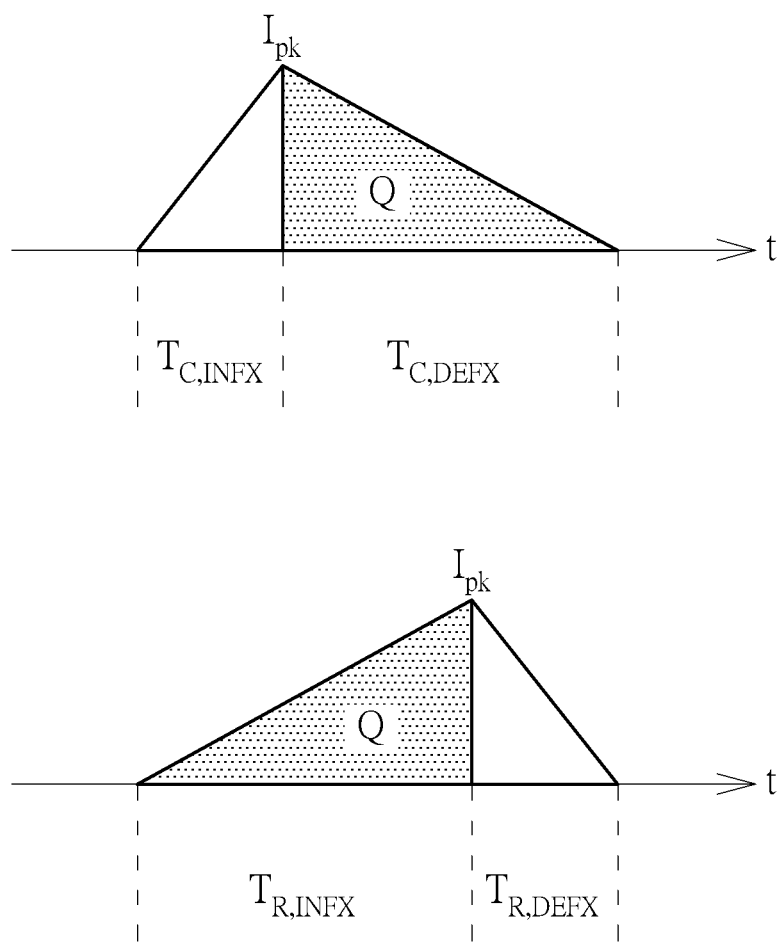
FIG. 8 illustrates a plot of an inductor current flowing through the inductor versus time.

Normally, the flux-increasing phase and the flux-decreasing phase in the charging operation or the recycling operation may be in a symmetric manner. However, in order to reduce conduction loss and power consumption, in an embodiment, the flux-increasing phase and the flux-decreasing phase in the charging operation or the recycling operation may be in an asymmetric manner. FIG. 8 illustrates a plot of an inductor current flowing through the inductor L1 versus time t. $I_{pk}$ represents a peak current of the inductor current, Q represent a specific amount of electronic charges needed to be poured into (or drained from) the capacity load C3. $T_{C,INFX}$ and $T_{C,DEFX}$ denote the InFlux phase and the DeFlux phase of the charging operation; while $T_{R,INFX}$ and $T_{R,DEFX}$ denote the InFlux phase and the DeFlux phase of the recycling operation. Symmetric manner means $T_{C,INFX}=T_{C,DEFX}$ and $T_{R,INFX}=T_{R,DEFX}$; while asymmetric manner means $T_{C,INFX} \neq T_{C,DEFX}$ and $T_{R,INFX} \neq T_{R,DEFX}$.

As can be shown in FIG. 8, if the period of the $T_{C,DEFX}$ is lengthened (e.g., $T_{C,DEFX}>T_{C,INFX}$), as top portion of FIG. 8 shows, a low value of peak current $I_{pk}$ can be exploited to charge the capacity load C3 to a certain amount/degree for the charging operation, such that conduction loss and power consumption can be reduced. Similarly, $T_{R,INFX}$ may be lengthened (e.g., $T_{R,INFX}>T_{R,DEFX}$) and similar rationale may be applied for the recycling operation, as bottom portion of FIG. 8 shows.

It can be achieved by 1) lowering the voltage difference between the two terminals of the inductor L1; and 2) designing the PWM signals (e.g., SP3 and SP2) such that $T_{C,DEFX}>T_{C,INFX}$ or $T_{R,INFX}>T_{R,DEFX}$ may be achieved.

To achieve item 1) in the above, the second terminal of the switch T2 may receive a (positive) voltage $V_{BAT}$, instead of connected/coupled to the ground (as shown in FIG. 7), for the charging operation. On the other hand, for the recycling operation, the second terminal of the switch T4 may receive a (positive) voltage $V_{BAT}'$, instead of being connected/coupled to the ground (as shown in FIG. 7). $V_{BAT}$ and $V_{BAT}'$ may or may not be the same, depending on practical situation.

Figure 9:
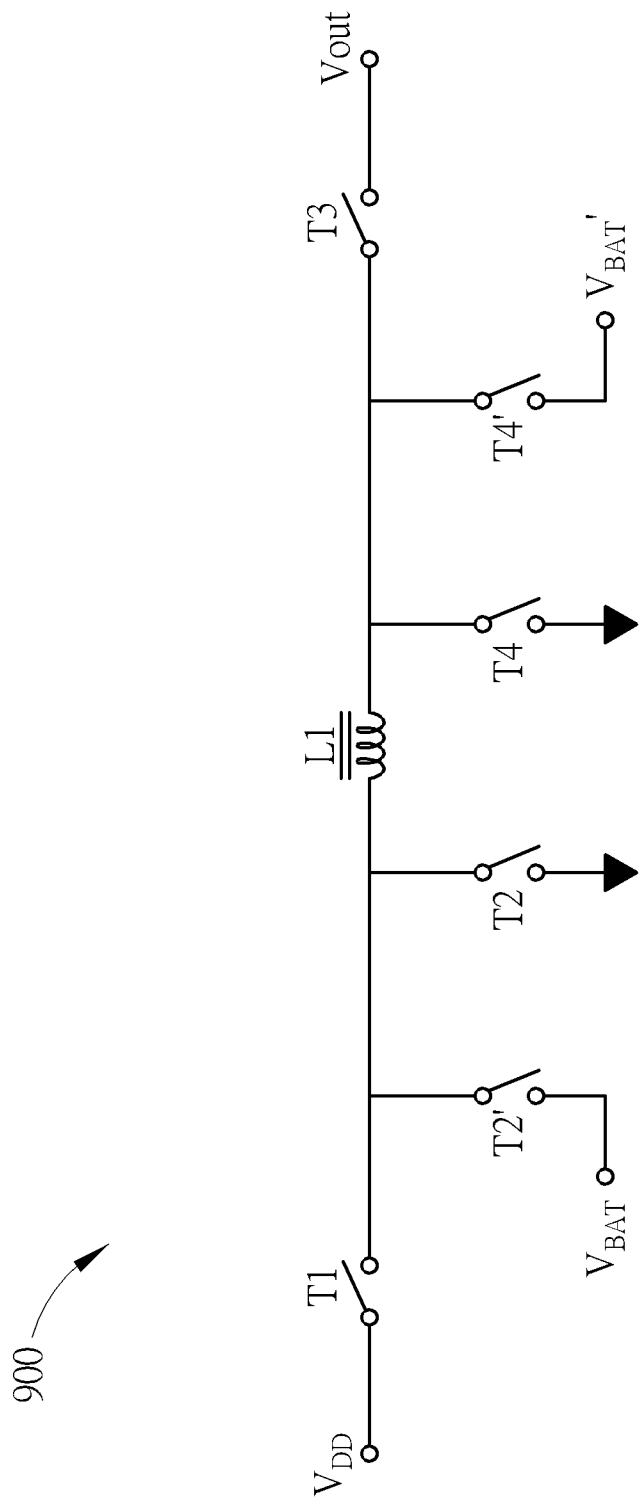
FIG. 9 illustrates a bidirectional circuit according to an embodiment of the present application.

FIG. 9 illustrates a bidirectional circuit 900 according to an embodiment of the present application. In addition to the bidirectional circuit 100, the bidirectional circuit 900 further comprises switches T2' and T4', controlled by PWM signals SP2' and SP4', respectively. First terminals of the switches T2' and T4' are coupled to the inductor L1. Second terminals of the switches T2' and T4' receives $V_{BAT}$ and $V_{BAT}'$, respectively. By properly designing the PWM signals SP1-SP4, SP2' and SP4', (a) symmetric manner of InFlux versus DeFlux may be achieved. In the present application, symmetric manner indicates InFlux time and Deflux time are the same, while asymmetric manner indicates InFlux time and Deflux time are different.

Figure 10:
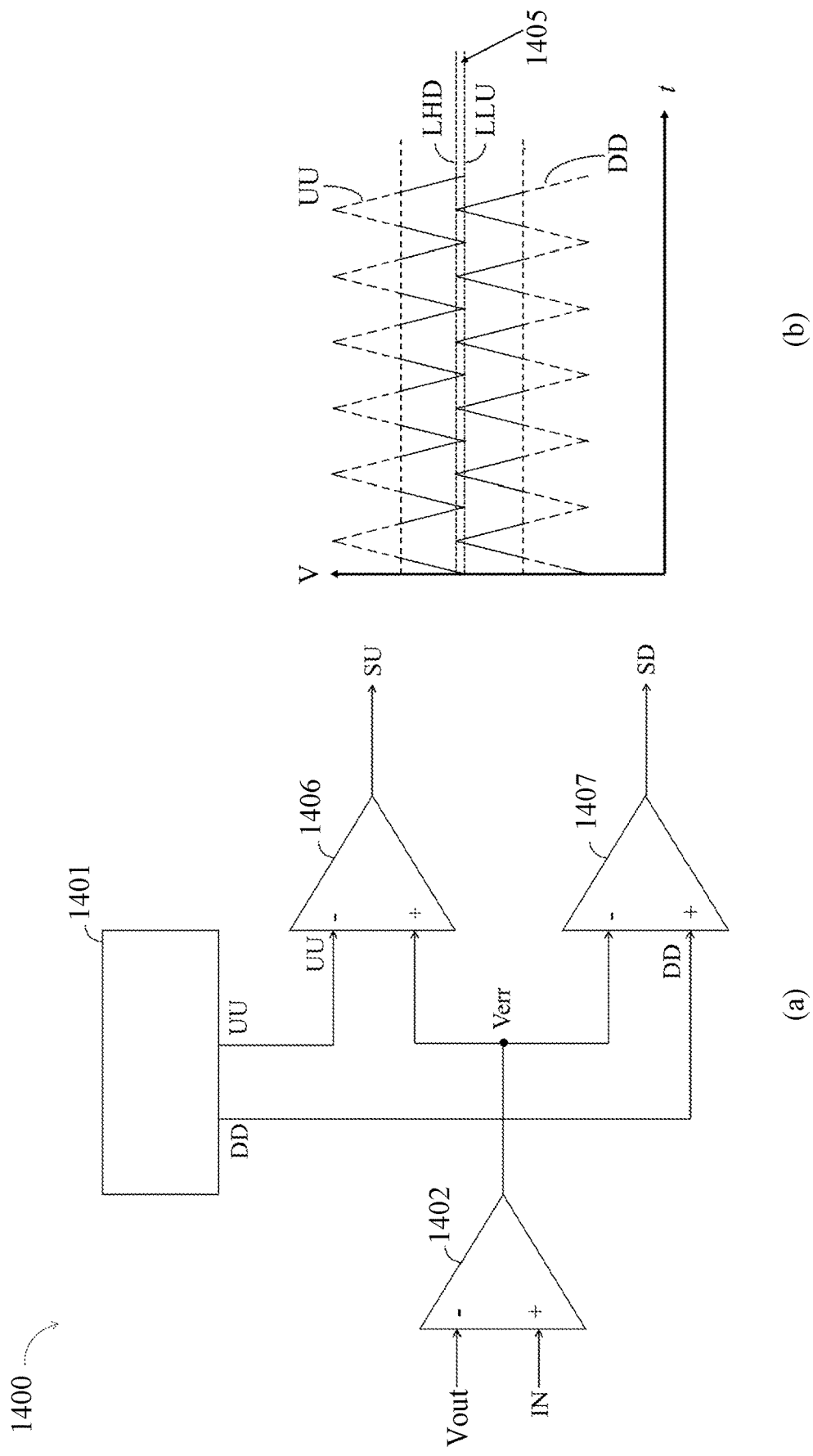
FIG. 10 is a schematic diagram of a PWM controller 1400 according to an embodiment of the present application.

Circuit topology of the PWM controller is not limited. For example, FIG. 10 illustrates a schematic diagram of a PWM controller 1400 according to an embodiment of the present application. The PWM signals SP1-SP4 may be generated according to the circuit 1400. The PWM controller 1400 is configured to generate a first PWM signal SU and a second PWM signal SD. The circuit 1400 may be comprised within the PWM controller 76, as an example.

An error amplifier 1402 of the circuit 1400 generates an error signal Verr from the input signal IN and the output signal Vout. Without entering a saturation region of the error amplifier 1402, the error signal Verr represents an amplified version of the difference between the input signal IN and the output signal Vout.

A comparing signal generator 1401 of the circuit 1400 is configured to generate a first comparing signal UU and a second comparing signal DD. The first comparing signal UU may be an offset-or-scaled version of the second comparing signal DD, and/or vice versa. In other words, the comparing signals UU/DD may be expressed as $UU=\alpha \cdot DD+\Delta'$, where $\Delta'$ represents an offset, and a represents some scaling factor, which can be greater than 1 (i.e., $\alpha>1$) or less than 1 (i.e., $\alpha<1$).

A comparator 1406 of the circuit 1400 compares the error signal Verr with the first comparing signal UU, to generate the first PWM signal SU; a comparator 1407 of the PWM controller 1400 compares the error signal Verr with the second comparing signal DD, to generate the second PWM signal SD. In other words, The PWM controller 1400 generates the first PWM signal SU and the second PWM signal SD according to the difference between the input signal IN and the output signal Vout.

As shown in FIG. 10, the pulse width of the first PWM signal SU or the second PWM signal SD may be determined by the PWM controller 1400 according to a difference between the input signal IN and the output signal Vout. For example, the lowest (voltage) level LLU of the first comparing signal UU may be less than the highest (voltage) level LHD of the second comparing signal DD, meaning that there is an overlapping region 1405 between the lowest level LLU and the highest level LHD. When the error signal Verr is within the voltage range of the overlapping region 1405, the comparator 1406 would generate the first PWM signal SU with low duty factor, and the comparator 1407 would generate the second PWM signal SD with low duty factor. As the output signal Vout increases progressively above the input signal IN, the error signal Verr may drop progressively below the voltage range of the overlapping region 1405, which may turn off the first PWM signal SU and progressively increase the duty factor of the second PWM signal SD. Alternatively, as the output signal Vout decreases progressively below the input signal IN, the error signal Verr may rise progressively above the voltage range of the overlapping region 1405, which may turn off the second PWM signal SD and progressively increase the duty factor of the first PWM signal SU.

Note that, according to operation of the circuit 1400, pulse widths of the PWM signals SU and SD are determined according to a difference between the input signal IN and the output signal Vout. The PWM signal SU may be used for charging operation of the bidirectional circuit 100, and the PWM signal SD may be used for discharging/recycling operation of the bidirectional circuit 100. For the charging operation, when the difference between the input signal IN and the output signal Vout is larger, the circuit 1400 may generate the PWM signal SU with wider pulse width, and the output signal Vout may be increased more by performing the charging operation with wider PWM signal SU. For the discharging operation, when the difference between the input signal IN and the output signal Vout is larger, the circuit 1400 may generate the PWM signal SD with wider pulse width, and the output signal Vout may be decreased more by performing the discharging operation with wider PWM signal SD.

Note that, the circuit 1400 illustrates (or functions as) an embodiment of generating PWM signal with pulse width related/proportional to the difference between the input signal IN and the output signal Vout. The PWM controller of the present application is not limited to comprising the circuit 1400. As long as the PWM controller is able to generate PWM signal with pulse width related to or substantially proportional to the difference between the input signal IN and the output signal Vout, requirement of the present application is satisfied, which is within the scope of present application.

In other words, by using the PWM signals SU for the charging operation, the first current may be formed and flow from the voltage source 11 to the capacitive load C3 during the charging phase, which is a first (time) interval corresponding to an upswing portion of the input signal IN. On the other hand, by using the PWM signal SD for the discharging/recycling operation, the second current may be formed and flow from the capacitive load C3 back to the voltage source 11 during the discharging/recycling phase, which is a second (time) interval corresponding to a downswing portion of the input signal IN.

To sum up, the present application provides the bidirectional circuit for a capacitive load of a piezo speaker, which may be applied for a situation that the load voltage may swing both above and below the voltage level of the source voltage. Besides, the present application further provides a bidirectional circuit with a mixed mode solution by applying single-end configuration for smaller signal swings while switching to BTL configuration for larger signal swings, to achieve both the lower-distortion of the single-end configuration and the doubling of output voltage range of BTL configuration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving circuit, configured to drive a capacitive load according to an input signal, the driving circuit comprising:
    a bidirectional circuit, coupled between a voltage source and the capacitive load, wherein the bidirectional circuit is configured to form a first current from the voltage source to the capacitive load when performing a charging operation and form a second current from the capacitive load to the voltage source when performing a recycling operation, the bidirectional circuit comprising:
        a first switch, comprising a first terminal coupled to the voltage source, and a second terminal;
        a second switch, comprising a first terminal coupled to the second terminal of the first switch, and a second terminal;
        an inductor, comprising a first terminal coupled to the second terminal of the first switch and the first terminal of the second switch, and a second terminal;
        a third switch, comprising a first terminal coupled to the second terminal of the inductor, and a second terminal coupled to a first terminal of the capacitive load; and
        a fourth switch, comprising a first terminal coupled to the second terminal of the inductor and the first terminal of the third switch, and a second terminal;
    a pulse width modulation (PWM) controller, receiving the input signal and coupled to the capacitive load so as to receive an output signal of the capacitive load, configured to generate a plurality of PWM signals according to the input signal and the output signal;
    wherein the first switch, the second switch, the third switch and the fourth switch are controlled by the plurality of PWM signals generated by the PWM controller according to the input signal and the output signal, such that the output signal is substantially proportional to the input signal;
    wherein the input signal and the output signal are time varying signals.

2. The driving circuit of claim 1, wherein the first switch and the fourth switch are conducted during a first phase of the charging operation.

3. The driving circuit of claim 1, wherein when a source voltage of the voltage source is higher than an output voltage at the first terminal of the capacitive load by a specific margin, the first switch and the third switch are conducted during a first phase of the charging operation.

4. The driving circuit of claim 1, wherein the second switch and the third switch are conducted during a second phase of the charging operation.

5. The driving circuit of claim 1, wherein when an output voltage at the first terminal of the capacitive load is significant higher than a source voltage of the voltage source, the first switch and the third switch are conducted during a second phase of the charging operation.

6. The driving circuit of claim 1, wherein the third switch is conducted during a second phase of the charging operation and is turned off when a current of the inductor diminishes to zero.

7. The driving circuit of claim 1, wherein the third switch is a MOSFET (Metal-Oxide-Semiconductor Field-Effect Transistor), and a body diode of the third switch is pointed from the inductor toward the capacitive load.

8. The driving circuit of claim 1, wherein the second switch and the third switch are conducted during a first phase of the recycling operation.

9. The driving circuit of claim 1, wherein when a source voltage of the voltage source is lower than an output voltage at the first terminal of the capacitive load by a specific margin, the first switch and the third switch are conducted during a first phase of the recycling operation.

10. The driving circuit of claim 1, wherein the first switch and the fourth switch are conducted during a second phase of the recycling operation.

11. The driving circuit of claim 1, wherein when a source voltage of the voltage source is significantly higher than an output voltage at the first terminal of the capacitive load, the first switch and the third switch are conducted during a second phase of the recycling operation.

12. The driving circuit of claim 1, wherein the first switch is conducted during a second phase of the recycling operation and is turned off when a current of the inductor diminishes to zero.

13. The driving circuit of claim 1, wherein the first switch is a MOSFET, and a body diode of the first switch is pointed from the inductor toward the voltage source.

14. The driving circuit of claim 1, wherein the bidirectional circuit further comprises:
a fifth switch, connected to the voltage source, a load circuit and a ground;
wherein the load circuit comprises the capacitive load, a first node and a second node connected to the fifth switch;
wherein when a magnitude of a voltage across the first node and the second node of the load circuit is less than a threshold voltage, the fifth switch conducts a connection between the source voltage and the second node of the load circuit.

15. The driving circuit of claim 14, wherein when the magnitude of the voltage across the first node and the second node is greater than the threshold voltage, the fifth switch conducts a connection between the second node and the ground.

16. The driving circuit of claim 14, wherein the load circuit comprises:
a first toggle switch, connected to the first terminal of the capacitive load, the first node and the second node; and
a second toggle switch, connected to the second terminal of the capacitive load, the first node and the second node.

17. The driving circuit of claim 16, wherein
when the input signal indicates that a voltage across the capacitive load is to be positive, the first toggle switch conducts a connection between the first terminal of the capacitive load and the first node, and the second toggle switch conducts a connection between the second terminal of the capacitive load and the second node;
wherein when the input signal indicates that the voltage across the capacitive load is to be negative, the first toggle switch conducts a connection between the first terminal of the capacitive load and the second node, and the second toggle switch conducts a connection between the second terminal of the capacitive load and the first node.

18. The driving circuit of claim 1, wherein during a flux-decreasing phase of the charging operation or during a flux-increasing phase of the recycling operation, a voltage difference between the first and the second terminals of the inductor is less than an output voltage.

19. The driving circuit of claim 18, wherein the second terminal of the second switch receives a first voltage during a flux-decreasing phase of the charging operation or the second terminal of the fourth switch receives a second voltage during a flux-increasing phase of the recycling operation, such that the voltage difference between the first and the second terminals of the inductor is less than an output voltage.

20. The driving circuit of claim 19, wherein the bidirectional circuit comprises:
a sixth switch, controlled by a PWM signal generated by the PWM controller, comprising a first terminal coupled to the first terminal of the inductor, and a second terminal;
wherein the second terminal of the second switch is coupled to a ground;
wherein the second terminal of the sixth switch receives the first voltage.

21. The driving circuit of claim 19, wherein the bidirectional circuit comprises:
a seventh switch, controlled by a PWM signal generated by the PWM controller, comprising a first terminal coupled to the second terminal of the inductor, and a second terminal;
wherein the second terminal of the fourth switch is coupled to a ground;
wherein the second terminal of the seventh switch receives the second voltage.

22. The driving circuit of claim 1, wherein the plurality of the PWM signals is generated such that for the charging operation, a first duration of a flux-increasing phase is less than or equal to a second duration of a flux-decreasing phase.

23. The driving circuit of claim 1, wherein the plurality of the PWM signals is generated such that for the recycling operation, a first duration of a flux-increasing phase is longer than or equal to a second duration of a flux-decreasing phase.

24. The driving circuit of claim 1, wherein the PWM controller generates the plurality of PWM signals, such that a pulse width of a PWM signal among the plurality of PWM signals is determined, by the PWM controller, according to a difference between the input signal and the output signal.

25. The driving circuit of claim 1, wherein the driving circuit is configured to drive a capacitive speaker load and generate an output audio signal according to an input audio signal, and the output audio signal is substantially proportional to the input audio signal.

26. The driving circuit of claim 1, wherein the PWM controller controls the bidirectional circuit, such that the first current is formed during a first interval corresponding to an upswing portion of the input signal and the second current is formed during a second interval corresponding to a downswing portion of the input signal.

* * * * *